United States Patent
Ito

(10) Patent No.: US 9,503,101 B2
(45) Date of Patent: Nov. 22, 2016

(54) PHASE LOCKED LOOP CIRCUIT

(71) Applicant: Kabushiki Kaisha Toshiba, Minato-Ku, Tokyo (JP)

(72) Inventor: Tomohiko Ito, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/847,431

(22) Filed: Sep. 8, 2015

(65) Prior Publication Data

US 2016/0277033 A1   Sep. 22, 2016

(30) Foreign Application Priority Data

Mar. 16, 2015   (JP) .................................. 2015-051970

(51) Int. Cl.
  *H03L 7/06*   (2006.01)
  *H03L 7/081*   (2006.01)
  *H03L 7/08*   (2006.01)

(52) U.S. Cl.
  CPC ............... *H03L 7/0814* (2013.01); *H03L 7/08* (2013.01)

(58) Field of Classification Search
  CPC .......... H03L 7/099; H03L 7/085; H03L 7/10
  USPC ......... 327/156–159, 147–150; 375/373–376; 331/1 A, 1 R
  See application file for complete search history.

(56) References Cited

U.S. PATENT DOCUMENTS

| | | |
|---|---|---|
| 7,253,691 B2 | 8/2007 | Okada |
| 7,436,340 B2 | 10/2008 | Sasaki |
| 2010/0127739 A1 * | 5/2010 | Ebuchi .................. H03L 7/0898 327/148 |
| 2011/0267122 A1 | 11/2011 | Jeong et al. |
| 2013/0328603 A1 | 12/2013 | Kawasoe |
| 2015/0280723 A1 * | 10/2015 | Fan .......................... H03L 7/085 327/156 |

FOREIGN PATENT DOCUMENTS

| | | |
|---|---|---|
| JP | H01-268291 A | 10/1989 |
| JP | 2006-262520 A | 9/2006 |

OTHER PUBLICATIONS

Mike Shuo-Wei Chen et al., "A Calibration-Free 800 MHz Fractional-N Digital PLL With Embedded TDC", IEEE Journal of Solid-State Circuits, vol. 45, No. 12 (Dec. 2010).

* cited by examiner

*Primary Examiner* — Licoln Donovan
*Assistant Examiner* — Thomas Skibinski
(74) *Attorney, Agent, or Firm* — White & Case LLP

(57) ABSTRACT

A phase locked loop circuit includes a first current source that outputs a current from a first output node. The phase locked loop circuit includes a driving current circuit that includes a first voltage node set at a voltage corresponding to a supplied current and outputs a driving current from a driving current node according to the current supplied to the first voltage node. The phase locked loop circuit includes a current-voltage converter circuit that includes a second voltage node set at a supplied current. The phase locked loop circuit includes a first current switch circuit that electrically connects the first output node and the first voltage node or electrically connects the first output node and the second voltage node. The phase locked loop circuit includes an oscillator that receives the driving current and changes an oscillatory frequency according to a magnitude of the driving current.

16 Claims, 7 Drawing Sheets

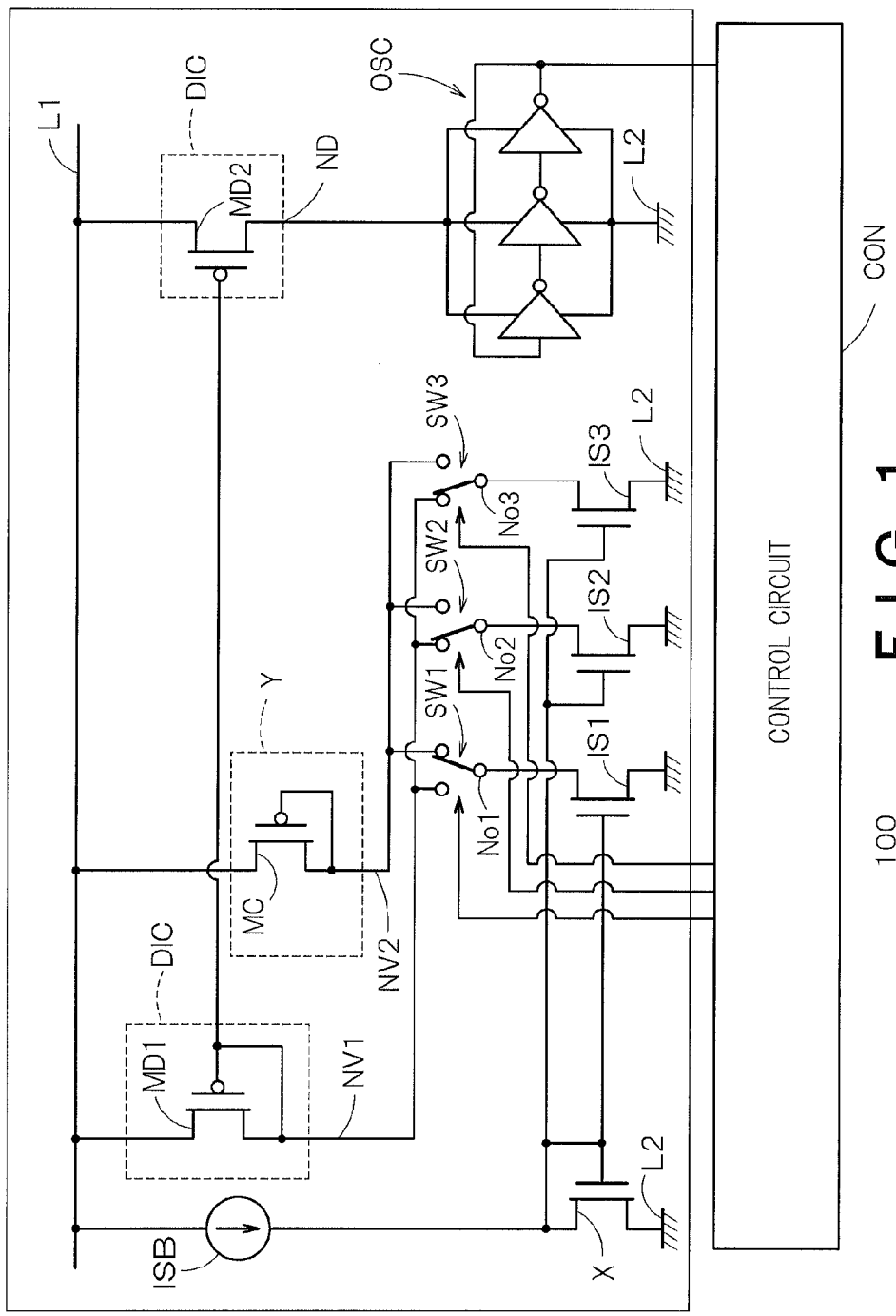
F I G. 1

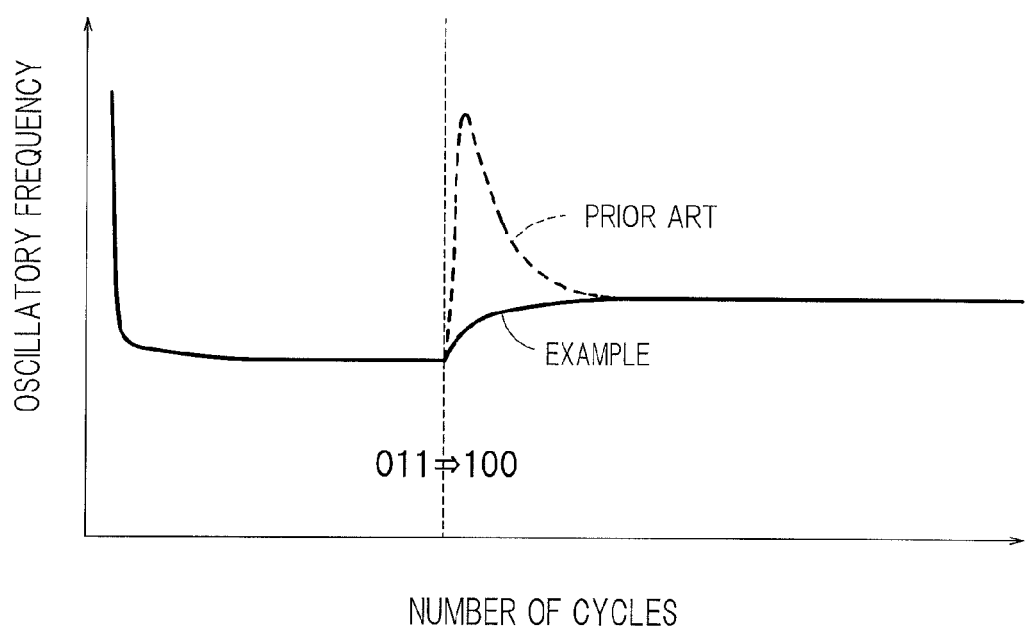
F I G. 2

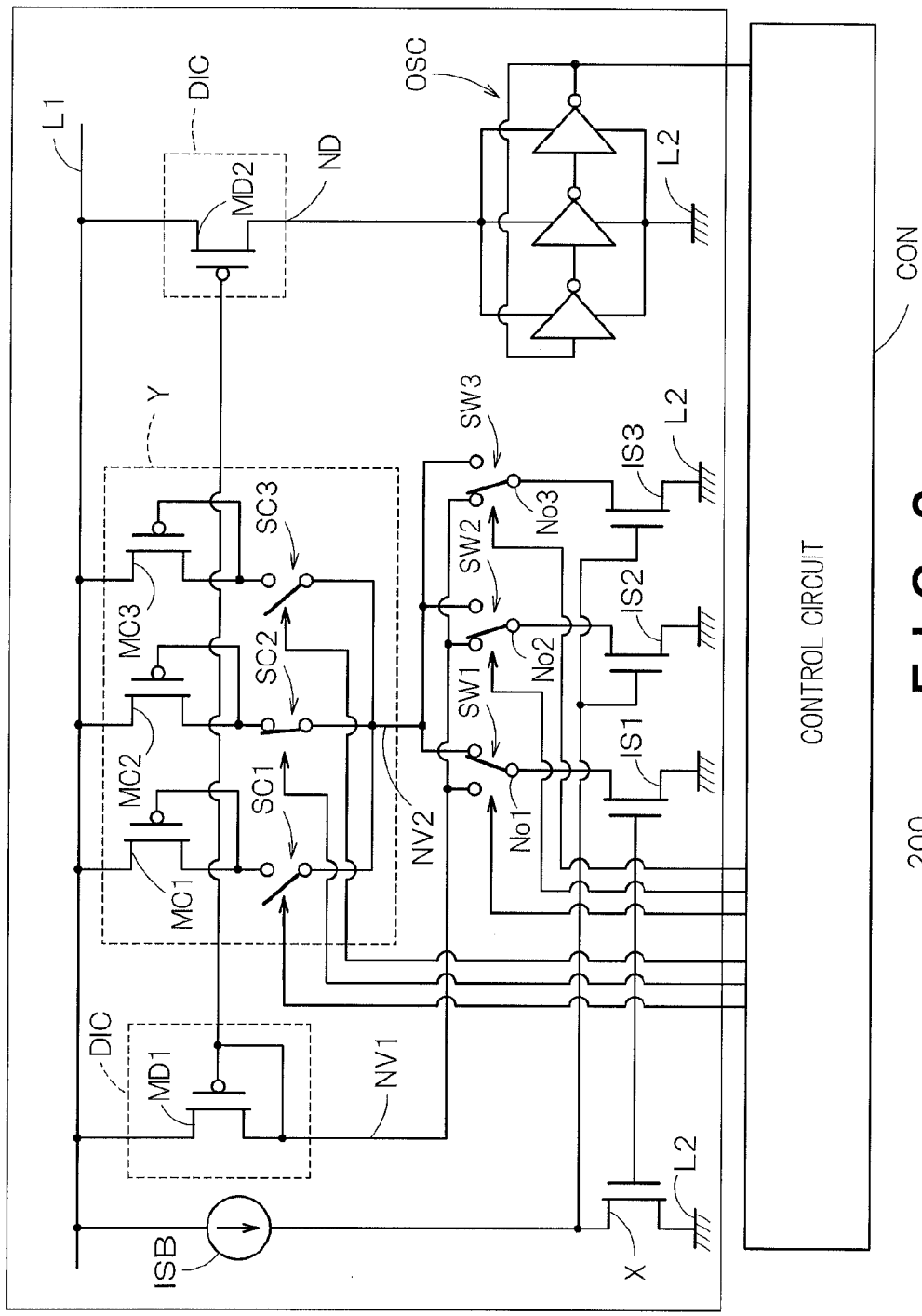
F I G. 3

| PREVIOUS CODE | CURRENT CODE | SUBSEQUENT CODE |
|---|---|---|
|  | 000 | 001 |
| 000 | 001 | 010 |
| 001 | 010 | 011 |
| 010 | 011 | 100 |
| 011 | 100 | 101 |
| 100 | 101 | 110 |
| 101 | 110 | 111 |

F I G. 7

PHASE LOCKED LOOP CIRCUIT

CROSS-REFERENCE TO RELATED APPLICATION

This application is based upon and claims the benefit of priority from the prior Japanese Patent Application No. 2015-051970, filed on Mar. 16, 2015, the entire contents of which are incorporated herein by reference.

BACKGROUND

1. Field

Embodiments described herein relate generally to a phase locked loop circuit.

2. Background Art

A conventional phase locked loop circuit (PLL circuit) converts a digital code into an analog value of current or the like by means of a D/A converter (Digital-to-Analog Converter: DAC) and controls an oscillatory frequency according to the analog value.

Such a conventional phase locked loop circuit may cause a transitional overcurrent (glitch) at the moment of switching of the digital codes of a DAC, temporarily increasing an oscillatory frequency error. In this case, such a phase locked loop circuit is unusable in a system complying with exacting specifications about oscillatory frequency errors.

Moreover, the conventional phase locked loop circuit includes, for example, a filter inserted into the current path of a DAC to suppress the glitch. However, this configuration increases the circuit area of the phase locked loop circuit.

BRIEF DESCRIPTION OF THE DRAWINGS

FIG. 1 is a circuit diagram showing a configuration example of a phase locked loop circuit 100 according to a first embodiment;

FIG. 2 is a figure showing a simulation result example of the oscillatory frequency of the phase locked loop circuit 100 shown in FIG. 1;

FIG. 3 is a circuit diagram showing a configuration example of a phase locked loop circuit 200 according to a second embodiment;

FIG. 7 is a figure showing an example of digital codes inputted to the phase locked loop circuit.

DETAILED DESCRIPTION

Figure 4:
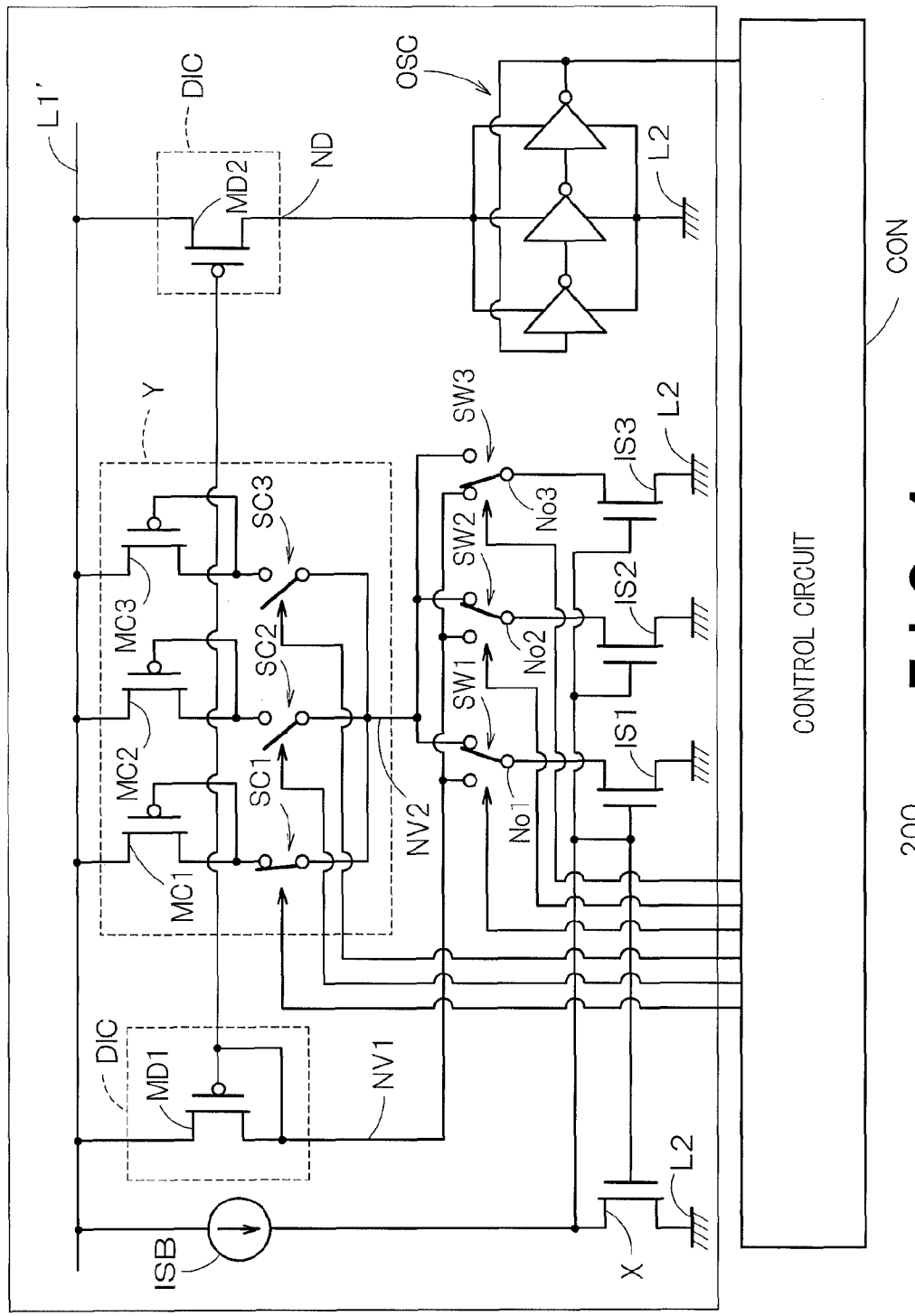
FIG. 4 is a circuit diagram showing a changed switching state of first to third switch circuits SW1 to SW3 of the phase locked loop circuit 200 shown in FIG. 3.

A phase locked loop circuit according to an embodiment includes a first current source that outputs a current from a first output node. The phase locked loop circuit includes a second current source that outputs a current from a second output node. The phase locked loop circuit includes a driving current circuit that includes a first voltage node set at a voltage corresponding to a supplied current and outputs a driving current from a driving current node according to the current supplied to the first voltage node. The phase locked loop circuit includes a current-voltage converter circuit that includes a second voltage node set at a supplied current. The phase locked loop circuit includes a first current switch circuit that electrically connects the first output node and the first voltage node or electrically connects the first output node and the second voltage node. The phase locked loop circuit includes a second current switch circuit that electrically connects the second output node and the first voltage node or electrically connects the second output node and the second voltage node. The phase locked loop circuit includes an oscillator that receives the driving current and changes an oscillatory frequency according to a magnitude of the driving current. The phase locked loop circuit includes a control circuit that controls the first and second current switch circuits.

Embodiments will be described below with reference to the accompanying drawings.

First Embodiment

FIG. 1 is a circuit diagram showing a configuration example of a phase locked loop circuit 100 according to a first embodiment. In the example of FIG. 1, three current sources and three current switch circuits are illustrated. The number of current sources and the number of current switch circuits may be two or at least four.

As shown in FIG. 1, the phase locked loop circuit 100 includes a first current source IS1, a second current source IS2, a third current source IS3, a driving current circuit DIC, a current-voltage converter circuit Y, a first current switch circuit SW1, a second current switch circuit SW2, a third current switch circuit SW3, an oscillator OSC, a control circuit CON, a reference MOS transistor X, and a reference current source ISB.

The first to third current sources IS1 to IS3 and the first to third current switch circuits SW1 to SW3 constitute a D/A converter.

A power supply voltage is supplied to a first potential line L1. A ground voltage is supplied to a second potential line L2.

One end of the reference current source ISB is connected to the first potential line L1 and outputs a constant reference current.

One end (drain) of the reference MOS transistor X is connected to the other end of the reference current source ISB and the other end (source) of the reference MOS transistor X is connected to the second potential line L2, making a diode connection. In the example of FIG. 1, the reference MOS transistor X is an nMOS transistor.

The first current source IS1 outputs a current from a first output node NO1.

For example, as shown in FIG. 1, the first current source IS1 is a first current MOS transistor (nMOS transistor) with one end (drain) connected to the first output node NO1, the other end (source) connected to the second potential line L2, and a gate connected to the gate of the reference MOS transistor X.

Thus, the first current source IS1 outputs a mirror current of a current (reference current) passing through the reference MOS transistor X.

The second current source IS2 outputs a current from a second output node NO2.

For example, as shown in FIG. 1, the second current source IS2 is a second current MOS transistor (nMOS transistor) with one end (drain) connected to the second output node NO2, the other end (source) connected to the second potential line L2, and a gate connected to the gate of the reference MOS transistor X.

Thus, the second current source IS2 outputs a mirror current of a current (reference current) passing through the reference MOS transistor X.

The third current source IS3 outputs a current from a third output node NO3.

For example, as shown in FIG. 1, the third current source IS3 is a third current MOS transistor (nMOS transistor) with one end (drain) connected to the third output node NO3, the other end (source) connected to the second potential line L2, and a gate connected to the gate of the reference MOS transistor X.

Thus, the third current source IS3 outputs a mirror current (that is, a current proportionate to the reference current) of a current (reference current) passing through the reference MOS transistor X.

Moreover, a current outputted from the first current source IS1 is set larger than, for example, a current outputted from the second current source IS2. In other words, the drive capability (size, gate width) of the first current MOS transistor is set greater than that (size, gate width) of the second current MOS transistor.

Furthermore, a current outputted from the second current source IS2 is set larger than, for example, a current outputted from the third current source IS3. In other words, the drive capability (size, gate width) of the second current MOS transistor is set greater than that (size, gate width) of the third current MOS transistor.

The first to third current sources IS1 to IS3 may output an equal current.

If a current is not outputted from the first to third current sources, the first to third output nodes NO1 to NO3 have a ground voltage.

The driving current circuit DIC includes a first voltage node NV1 set at a voltage corresponding to a supplied current. The driving current circuit DIC outputs a driving current from a driving current node ND according to a current supplied to the first voltage node NV1.

For example, as shown in FIG. 1, the driving current circuit DIC includes a first driving MOS transistor MD1 and a second driving MOS transistor (pMOS transistor in the example of FIG. 1) MD2.

One end (source) of the first driving MOS transistor MD1 is connected to the first potential line L1 and the other end (drain) of the first driving MOS transistor MD1 is connected to the first voltage node NV1. In the example of FIG. 1, the first driving MOS transistor MD1 is a pMOS transistor.

One end of the second driving MOS transistor MD2 is connected to the first potential line L1 and the other end of the second driving MOS transistor MD2 is connected to the driving current node ND. In the example of FIG. 1, the second driving MOS transistor MD2 is a pMOS transistor.

In this configuration, as shown in FIG. 1, the first driving MOS transistor MD1 is diode-connected. The gate of the second driving MOS transistor MD2 is connected to the gate of the first driving MOS transistor MD1.

In this way, the first driving MOS transistor MD1 and the second driving MOS transistor MD2 constitute a current mirror circuit.

Specifically, the second driving MOS transistor MD2 passes, as a driving current, a current obtained by current-mirroring a current passing through the first driving MOS transistor MD1 (the driving current is outputted to the driving current node ND).

The current-voltage converter circuit Y includes a second voltage node NV2 set at a voltage corresponding to a supplied current.

For example, as shown in FIG. 1, the current-voltage converter circuit Y includes a conversion MOS transistor MC.

One end (source) of the conversion MOS transistor MC is connected to the first potential line L1 and the other end (drain) of the conversion MOS transistor MC is connected to the second voltage node NV2, making a diode connection. In the example of FIG. 1, the conversion MOS transistor MC is a pMOS transistor.

The first current switch circuit SW1 electrically connects the first output node NO1 and the first voltage node NV1 or electrically connects the first output node NO1 and the second voltage node NV2.

The second current switch circuit SW2 electrically connects the second output node NO2 and the first voltage node NV1 or electrically connects the second output node NO2 and the second voltage node NV2.

The third current switch circuit SW3 electrically connects the third output node NO3 and the first voltage node NV1 or electrically connects the third output node NO3 and the second voltage node NV2.

The oscillator OSC receives a driving current from the driving current circuit DIC and outputs an oscillation signal. The oscillator OSC changes an oscillatory frequency according to the magnitude of the driving current. For example, in the oscillator OSC, the oscillatory frequency of the oscillation signal increases with an increase in driving current, whereas the oscillatory frequency of the oscillation signal decreases with a reduction in driving current.

The control circuit CON controls the first to third current switch circuits SW1, SW2, and SW3 based on, for example, a digital code.

For example, the digital code is "011" in FIG. 1. In FIG. 1, based on the digital code "011", the first current switch circuit SW1 electrically connects the first output node NO1 and the second voltage node NV2, the second current switch circuit SW2 electrically connects the second output node NO2 and the first voltage node NV1, and the third current switch circuit SW3 electrically connects the third output node NO3 and the first voltage node NV1.

In this case, the first driving MOS transistor MD1 receives a current as large as the sum of currents passing through the second and third current sources IS2 and IS3.

The second driving MOS transistor MD2 passes, as a driving current, a current obtained by current-mirroring a current passing through the first driving MOS transistor MD1.

With this configuration, a driving current is supplied to the oscillator OSC according to a current passing through the second and third current sources IS2 and IS3, and the oscillatory frequency of the oscillation signal is set at a value corresponding to the driving current.

In this case, the first voltage node NV1 is set at a voltage corresponding to a current passing through the second and third current sources IS2 and IS3. Moreover, the same current as a current passing through the first current source IS1 is supplied to the conversion MOS transistor MC, thereby setting the second voltage node NV2 at a voltage corresponding to a current passing through the first current source IS1.

In other words, the voltage of the first voltage node NV1 is set closer to (more preferably is substantially equal to) the voltage of the second voltage node NV2.

For example, if the digital code is "100", the first current switch circuit SW1 electrically connects the first output node NO1 and the first voltage node NV1, the second current switch circuit SW2 electrically connects the second output node NO2 and the second voltage node NV2, and the third current switch circuit SW3 electrically connects the third output node NO3 and the second voltage node NV2.

In this case, the same current as a current passing through the first current source IS1 is supplied to the first driving MOS transistor MD1.

Moreover, the second driving MOS transistor MD2 supplies, as a driving current, a current obtained by current-mirroring a current passing through the first driving MOS transistor MD1.

Thus, the driving current is supplied to the oscillator OSC according to a current passing through the first current source IS1, and the oscillatory frequency of the oscillation signal is set at a value corresponding to the driving current.

In this way, the driving current is adjusted according to the digital code, adjusting the oscillatory frequency of the oscillator OSC.

The operating characteristics of the phase locked loop circuit 100 configured thus will be described below.

As described above, for example, in response to the digital code "011", the first current switch circuit SW1 electrically connects the first output node NO1 and the second voltage node NV2, the second current switch circuit SW2 electrically connects the second output node NO2 and the first voltage node NV1, and the third current switch circuit SW3 electrically connects the third output node NO3 and the first voltage node NV1.

In this case, the driving capabilities of the first to third current sources IS1 to IS3 are set such that the voltage of the first output node NO1 of the first current source IS1 with the first current switch circuit SW1 electrically connecting the first output node NO1 and the second voltage node NV2 is substantially equal to the voltages of the second and third output nodes NO2 and NO3 with the second current switch circuit SW2 electrically connecting the second output node NO2 and the first voltage node NV1 and the third current switch circuit SW3 electrically connecting the third output node NO3 and the first voltage node NV1. In other words, in this state, the first output node NO1, the second output node NO2, and the third output node NO3 are substantially equal in voltage.

This can reduce a difference in potential among the first to third output nodes NO1 to NO3 of the first to third switch circuits SW1 to SW3 (that is, a potential across the first voltage node NV1 and the second voltage node NV2).

After that, when the digital code changes to "100", the first current switch circuit SW1 electrically connects the first output node NO1 and the first voltage node NV1, the second current switch circuit SW2 electrically connects the second output node NO2 and the second voltage node NV2, and the third current switch circuit SW3 electrically connects the third output node NO3 and the second voltage node NV2.

The change of the digital code reduces a difference in potential among the first to third output nodes NO1 to NO3 of the first to third switch circuits SW1 to SW3 (that is, a potential across the first voltage node NV1 and the second voltage node NV2). This suppresses the occurrence of a transitional overcurrent (glitch).

FIG. 2 shows a simulation result example of the oscillatory frequency of the phase locked loop circuit 100 shown in FIG. 1.

As shown in FIG. 2, in the phase locked loop circuit 100, the influence of glitches is reduced at the time of a change of an oscillatory frequency when the digital code is changed from "011" to "100" (Example). As described above, in the phase locked loop circuit 100, when the digital code is changed from "011" to "100", the first to third output nodes NO1 to NO3 of the first to third current switch circuits SW1 to SW3 are substantially equal in potential (that is, a potential across the first voltage node NV1 and the second voltage node NV2). This suppresses a transitional overcurrent applied to the driving current circuit DIC, reducing a rapid change of the oscillatory frequency of the oscillator OSC.

In the prior art, the influence of glitches appears at the time of a change of an oscillatory frequency when the digital code is changed from "011" to "100".

The phase locked loop circuit 100 according to the present embodiment can suppress glitches and thus is usable in a system complying with exacting specifications about oscillatory frequency errors. Furthermore, the phase locked loop circuit 100 can reduce the size of a filter to be inserted into a current path of a D/A converter or omit the filter. This can achieve a smaller circuit area than in the prior art.

As described above, the phase locked loop circuit according to the first embodiment can obtain a smaller circuit area while reducing an oscillatory frequency error.

Second Embodiment

FIG. 3 is a circuit diagram showing a configuration example of a phase locked loop circuit 200 according to a second embodiment. FIG. 4 is a circuit diagram showing a changed switching state of first to third switch circuits SW1 to SW3 of the phase locked loop circuit 200 shown in FIG. 3. In FIGS. 3 and 4, the same reference numerals as in FIG. 1 indicate the same configurations as those of the first embodiment and the explanation thereof is omitted.

As shown in FIG. 3, as in the first embodiment, the phase locked loop circuit 200 includes a first current source IS1, a second current source IS2, a third current source IS3, a driving current circuit DIC, a current-voltage converter circuit Y, a first current switch circuit SW1, a second current switch circuit SW2, a third current switch circuit SW3, an oscillator OSC, a control circuit CON, a reference MOS transistor X, and a reference current source ISB.

The current-voltage converter circuit Y includes a second voltage node NV2 set at a voltage corresponding to a supplied current.

In the present embodiment, the circuit configuration of the current-voltage converter circuit Y is different from that of the first embodiment.

As shown in FIG. 3, the current-voltage converter circuit Y in the present embodiment includes, for example, a first conversion MOS transistor MC1, a second conversion MOS transistor MC2, a third conversion MOS transistor MC3, a first conversion switch circuit SC1, a second conversion switch circuit SC2, and a third conversion switch circuit SC3.

One end (source) of the first conversion MOS transistor MC1 is connected to a first potential line L1 so as to make a diode connection. In the example of FIG. 3, the first conversion MOS transistor MC1 is a pMOS transistor.

One end of the first conversion switch circuit SC1 is connected to the other end (drain) of the first conversion MOS transistor MC1 and the other end of the first conversion switch circuit SC1 is connected to the second voltage node NV2. The first conversion switch circuit SC1 is controlled to be turned on and off by the control circuit CON.

The first conversion switch circuit SC1 is turned on to electrically connect the other end (drain) of the first conversion MOS transistor MC1 and the second voltage node NV2 and is turned off to insulate the other end (drain) of the first conversion MOS transistor MC1 from the second voltage node NV2.

One end (source) of the second conversion MOS transistor MC2 is connected to the first potential line L1 so as to make a diode connection. In the example of FIG. 3, the second conversion MOS transistor MC2 is a pMOS transistor.

One end of the second conversion switch circuit SC2 is connected to the other end (drain) of the second conversion MOS transistor MC2 and the other end of the second conversion switch circuit SC2 is connected to the second voltage node NV2. The second conversion switch circuit SC2 is controlled to be turned on and off by the control circuit CON.

The second conversion switch circuit SC2 is turned on to electrically connect the other end (drain) of the second conversion MOS transistor MC2 and the second voltage node NV2 and is turned off to insulate the other end (drain) of the second conversion MOS transistor MC2 from the second voltage node NV2.

One end (source) of the third conversion MOS transistor MC3 is connected to the first potential line L1 so as to make a diode connection. In the example of FIG. 3, the third conversion MOS transistor MC3 is a pMOS transistor.

One end of the third conversion switch circuit SC3 is connected to the other end (drain) of the third conversion MOS transistor MC3 and the other end of the third conversion switch circuit SC3 is connected to the second voltage node NV2. The third conversion switch circuit SC3 is controlled to be turned on and off by the control circuit CON.

The third conversion switch circuit SC3 is turned on to electrically connect the other end (drain) of the third conversion MOS transistor MC3 and the second voltage node NV2 and is turned off to insulate the other end (drain) of the third conversion MOS transistor MC3 from the second voltage node NV2.

The drive capability (size, gate width) of the first conversion MOS transistor MC1 is set larger than that (size, gate width) of the second conversion MOS transistor MC2.

The drive capability (size, gate width) of the second conversion MOS transistor MC2 is set greater than that (size, gate width) of the third conversion MOS transistor MC3.

As described above, the control circuit CON controls the on and off of the conversion switch circuits SC1 to SC3 based on a digital code.

Other configurations of the phase locked loop circuit 200 are identical to those of the phase locked loop circuit 100 shown in FIG. 1.

The operating characteristics of the phase locked loop circuit 200 configured thus will be described below.

The voltage of the first voltage node NV1 changes according to a current passing through the first driving MOS transistor MD1. Similarly, the voltage of the second voltage node NV2 changes according to a current passing through the current-voltage converter circuit Y.

In the following explanation, the drive capability (size, gate width) of the conversion transistor of the current-voltage converter circuit Y is adjusted based on the digital code (that is, according to the magnitude of supplied current), adjusting the voltage of the second voltage node NV2.

For example, in response to a digital code "011" (median value), the first current switch circuit SW1 electrically connects a first output node NO1 and the second voltage node NV2, the second current switch circuit SW2 electrically connects a second output node NO2 and the first voltage node NV1, and the third current switch circuit SW3 electrically connects a third output node NO3 and the first voltage node NV1 (FIG. 3).

At this point, the control circuit CON turns off the first and third conversion switch circuits SC1 and SC3 and turns on the second conversion switch circuit SC2. Thus, the second conversion MOS transistor MC2 having medium drive capability (size, gate width) receives a current (median current) as large as a current passing through the first current source IS1.

In response to a digital code "001" (small value), the first current switch circuit SW1 electrically connects the first output node NO1 and the second voltage node NV2, the second current switch circuit SW2 electrically connects the second output node NO2 and the second voltage node NV2, and the third current switch circuit SW3 electrically connects the third output node NO3 and the first voltage node NV1 (FIG. 4).

At this point, the control circuit CON turns off the second and third conversion switch circuits SC2 and SC3 and turns on the first conversion switch circuit SC1. Thus, the second conversion MOS transistor MC2 having large drive capability (size, gate width) receives a current (large current) as large as a current passing through the first and second current sources IS1 and IS2.

In this way, the drive capability (size, gate width) of the conversion MOS transistor that passes the current of the current-voltage converter circuit Y is changed based on a digital code (that is, according to the magnitude of supplied current).

This configuration adjusts the voltage of the second voltage node NV2 according to the magnitude of supplied current. In other words, the voltages of the output nodes NO1 to NO3 of the current sources IS1 to IS3 can be brought closer to the voltage of the first voltage node NV1.

Other operating characteristics of the phase locked loop circuit 200 configured thus are identical to those of the first embodiment.

Specifically, as in the first embodiment, the phase locked loop circuit 200 according to the second embodiment can achieve a smaller circuit area while reducing an oscillatory frequency error.

Third Embodiment

Figure 5:
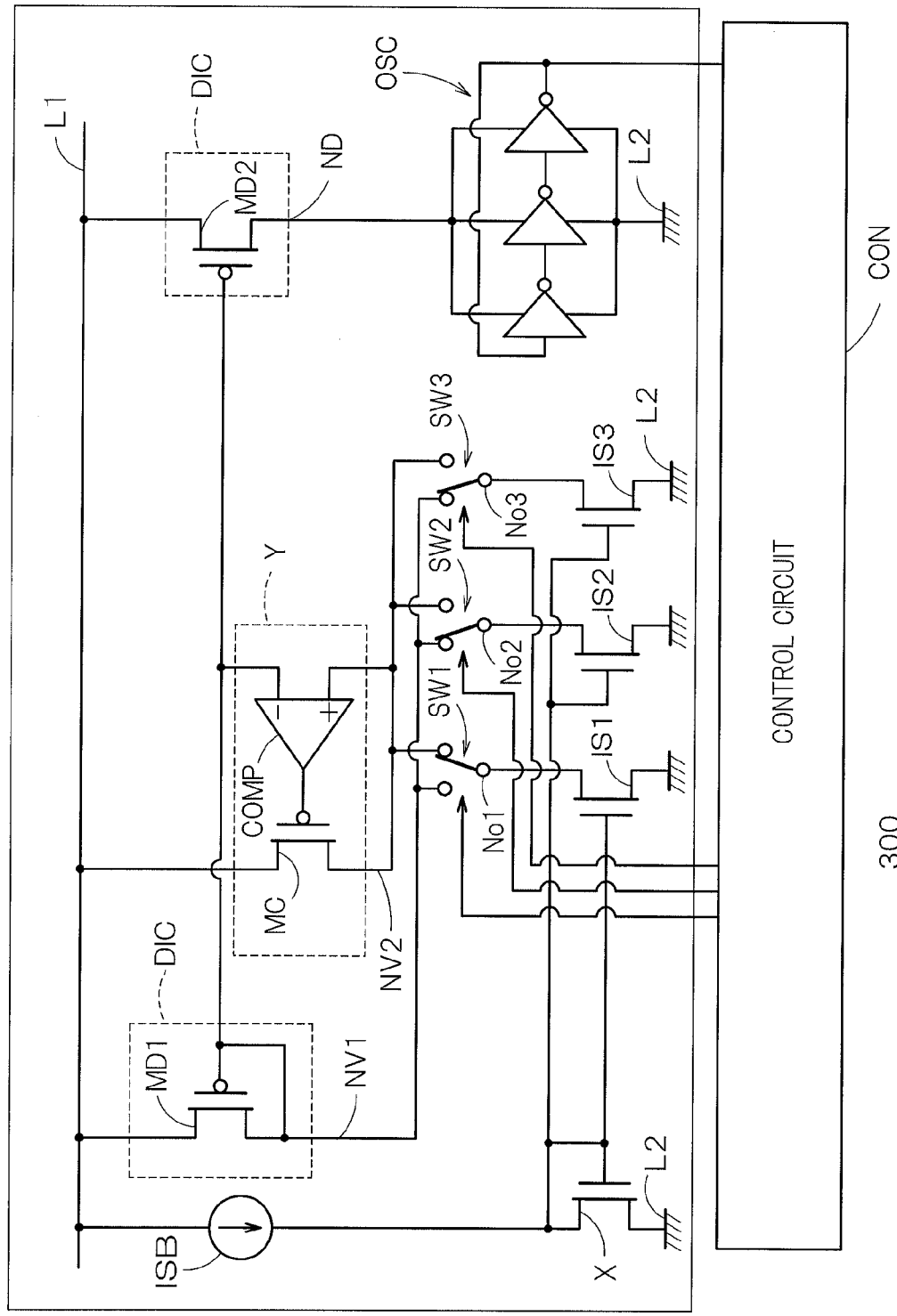
FIG. 5 is a circuit diagram showing a configuration example of a phase locked loop circuit 300 according to a third embodiment.

FIG. 5 is a circuit diagram showing a configuration example of a phase locked loop circuit 300 according to a third embodiment. In FIG. 5, the same reference numerals as in FIG. 1 indicate the same configurations as those of the first embodiment and the explanation thereof is omitted.

As shown in FIG. 5, as in the first embodiment, the phase locked loop circuit 300 includes a first current source IS1, a second current source IS2, a third current source IS3, a driving current circuit DIC, a current-voltage converter circuit Y, a first current switch circuit SW1, a second current switch circuit SW2, a third current switch circuit SW3, an oscillator OSC, a control circuit CON, a reference MOS transistor X, and a reference current source ISB.

The current-voltage converter circuit Y includes a second voltage node NV2 set at a voltage corresponding to a supplied current.

In the present embodiment, the circuit configuration of the current-voltage converter circuit Y is different from that of the first embodiment.

As shown in FIG. 5, the current-voltage converter circuit Y in the present embodiment includes, for example, a conversion MOS transistor MC and a comparator COMP.

One end (source) of the conversion MOS transistor MC is connected to a first potential line L1 and the other end (drain) of the conversion MOS transistor MC is connected to the second voltage node NV2. In the example of FIG. 5, the conversion MOS transistor MC is a pMOS transistor.

The inverting input terminal of the comparator COMP is connected to a first voltage node NV1, the non-inverting input terminal of the comparator COMP is connected to the second voltage node NV2, and the output of the comparator COMP is connected to the gate of the conversion MOS transistor MC.

The comparator COMP controls the conversion MOS transistor MC (controls the gate voltage of the conversion MOS transistor MC) such that the first voltage node NV1 and the second voltage node NV2 are equal in voltage.

For example, if the voltage of the first voltage node NV1 is higher than that of the second voltage node NV2, the comparator COMP controls the on-resistance of the conversion MOS transistor MC to a lower resistance. If the voltage of the first voltage node NV1 is lower than that of the second voltage node NV2, the comparator COMP controls the on-resistance of the conversion MOS transistor MC to a higher resistance.

Thus, the voltages of output nodes NO1 to NO3 of the current sources IS1 to IS3 can be brought closer to the voltage of the first voltage node NV1.

Other configurations of the phase locked loop circuit 300 are identical to those of the phase locked loop circuit 100 shown in FIG. 1.

Other operating characteristics of the phase locked loop circuit 300 configured thus are identical to those of the first embodiment.

Specifically, as in the first embodiment, the phase locked loop circuit 300 according to the third embodiment can achieve a smaller circuit area while reducing an oscillatory frequency error.

Fourth Embodiment

Figure 6:
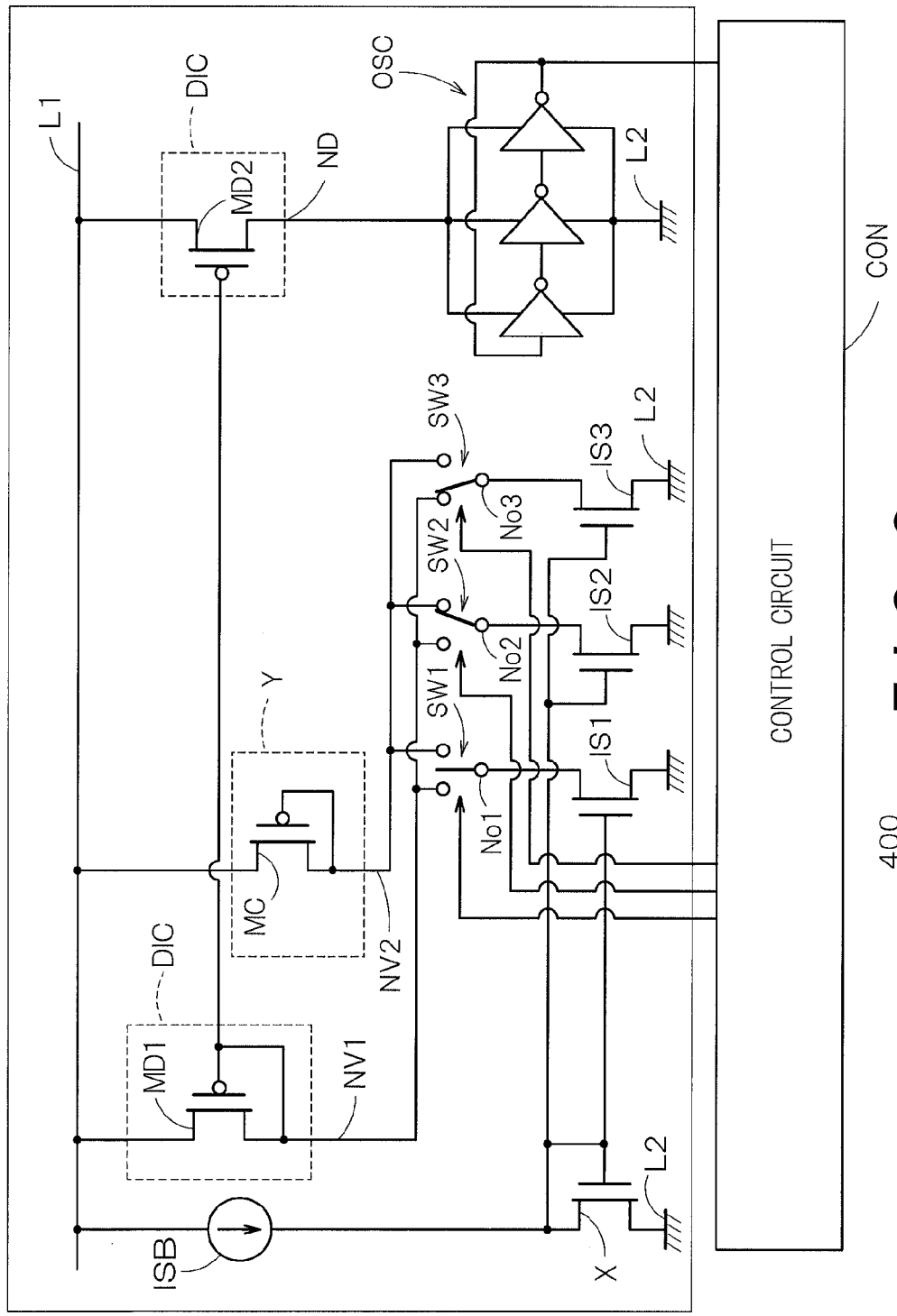
FIG. 6 is a circuit diagram showing a configuration example of a phase locked loop circuit 400 according to a fourth embodiment.

FIG. 6 is a circuit diagram showing a configuration example of a phase locked loop circuit 400 according to a fourth embodiment. In FIG. 6, the same reference numerals as in FIG. 1 indicate the same configurations as those of the first embodiment and the explanation thereof is omitted.

As shown in FIG. 6, as in the first embodiment, the phase locked loop circuit 400 includes a first current source IS1, a second current source IS2, a third current source IS3, a driving current circuit DIC, a current-voltage converter circuit Y, a first current switch circuit SW1, a second current switch circuit SW2, a third current switch circuit SW3, an oscillator OSC, a control circuit CON, a reference MOS transistor X, and a reference current source ISB.

The first current switch circuit SW1 electrically connects a first output node NO1 and a first voltage node NV1 or electrically connects the first output node NO1 and the second voltage node NV2.

The second current switch circuit SW2 electrically connects a second output node NO2 and the first voltage node NV1 or electrically connects the second output node NO2 and the second voltage node NV2.

The third current switch circuit SW3 electrically connects a third output node NO3 and the first voltage node NV1 or electrically connects the third output node NO3 and the second voltage node NV2.

In the present embodiment, the first current switch circuit SW1 can simultaneously insulate the first output node NO1 from the first voltage node NV1 and the first output node NO1 from the second voltage node NV2.

Similarly, the second current switch circuit SW2 can simultaneously insulate the second output node NO2 from the first voltage node NV1 and the second output node NO2 from the second voltage node NV2.

Likewise, the third current switch circuit SW3 can simultaneously insulate the third output node NO3 from the first voltage node NV1 and the third output node NO3 from the second voltage node NV2.

The control circuit CON controls the first to third current switch circuits SW1 to SW3 based on a digital code.

FIG. 7 shows an example of digital codes inputted to the phase locked loop circuit. As shown in FIG. 7, generally, DAC digital codes used for phase locked loop circuits (PLL circuits) are not considerably changed at a time.

If a digital code is only changed by ±1, a current code "001" only changes to a subsequent code "010" or "000". Thus, the current of the most significant bit (first current source IS1) does not need to be supplied to the current-voltage converter circuit Y. In this case, the first current switch circuit SW1 simultaneously insulates the first output node NO1 from the first voltage node NV1 and the first output node NO1 from the second voltage node NV2.

Specifically, the control circuit CON controls the first current switch circuit SW1 according to an amount of change of the digital code so as to simultaneously insulate the first output node NO1 from the first voltage node NV1 and the first output node NO1 from the second voltage node NV2.

In this state, the control circuit CON further controls the second current switch circuit SW2 so as to switch between electrical connection between the second output node NO2 and the first voltage node NV1 and electrical connection between the second output node NO2 and the second voltage node NV2 (the digital code is changed from "001" to "010"). Alternatively, the control circuit CON controls the third current switch circuit SW3 so as to switch between electrical connection between the third output node NO3 and the first voltage node NV1 and electrical connection between the third output node NO3 and the second voltage node NV2 (the digital code is changed from "001" to "000").

In this way, a change of the digital code is estimated using the tendency of the DAC digital code used for the PLL and an amount of current passing through the current-voltage converter circuit Y is controlled. This can further reduce power consumption.

Other configurations of the phase locked loop circuit 400 are identical to those of the phase locked loop circuit 100 shown in FIG. 1.

Other operating characteristics of the phase locked loop circuit 400 configured thus are identical to those of the first embodiment.

Specifically, as in the first embodiment, the phase locked loop circuit 400 according to the fourth embodiment can achieve a smaller circuit area while reducing an oscillatory frequency error.

The configuration of the fourth embodiment is applied to the first embodiment but is similarly applicable to the second and third embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A phase locked loop circuit comprising:
a first current source that outputs a current from a first output node;
a second current source that outputs a current from a second output node;
a driving current circuit that includes a first voltage node set at a voltage corresponding to a supplied current and outputs a driving current from a driving current node according to the current supplied to the first voltage node;
a current-voltage converter circuit that includes a second voltage node set at a supplied current;
a first current switch circuit that electrically connects the first output node and the first voltage node or electrically connects the first output node and the second voltage node;
a second current switch circuit that electrically connects the second output node and the first voltage node or electrically connects the second output node and the second voltage node;
an oscillator that receives the driving current and changes an oscillatory frequency according to a magnitude of the driving current; and
a control circuit that controls the first and second current switch circuits.

2. The phase locked loop circuit according to claim 1, wherein the driving current circuit includes:
a first driving MOS transistor with a first end connected to a first potential line and a second end connected to the first voltage node; and
a second driving MOS transistor with a first end connected to the first potential line and a second end connected to the driving current node, the second driving MOS transistor passing, as the driving current, a current obtained by current-mirroring a current passing through the first driving MOS transistor.

3. The phase locked loop circuit according to claim 2, wherein the first driving MOS transistor is diode-connected, and
the second driving MOS transistor has a gate that is connected to a gate of the first driving MOS transistor.

4. The phase locked loop circuit according to claim 3, wherein the current-voltage converter circuit includes a diode-connected conversion MOS transistor with a first end connected to the first potential line and a second end connected to the second voltage node.

5. The phase locked loop circuit according to claim 3, wherein the current-voltage converter circuit includes:
a diode-connected first conversion MOS transistor with a first end connected to the first potential line;
a first conversion switch circuit with a first end connected to a second end of the first conversion MOS transistor and a second end connected to the second voltage node;
a diode-connected second conversion MOS transistor with a first end connected to the first potential line; and
a second conversion switch circuit with a first end connected to a second end of the second conversion MOS transistor and a second end connected to the second voltage node, and
the control circuit controls the first conversion switch circuit and the second conversion switch circuit.

6. The phase locked loop circuit according to claim 3, wherein the current-voltage converter circuit includes:
a conversion MOS transistor with a first end connected to the first potential line and a second end connected to the second voltage node; and
a comparator that controls the conversion MOS transistor such that the first voltage node and the second voltage node are equal in voltage.

7. The phase locked loop circuit according to claim 2, wherein the current-voltage converter circuit includes a diode-connected conversion MOS transistor with a first end connected to the first potential line and a second end connected to the second voltage node.

8. The phase locked loop circuit according to claim 2, wherein the current-voltage converter circuit includes:
a diode-connected first conversion MOS transistor with a first end connected to the first potential line;
a first conversion switch circuit with a first end connected to a second end of the first conversion MOS transistor and a second end connected to the second voltage node;
a diode-connected second conversion MOS transistor with a first end connected to the first potential line; and
a second conversion switch circuit with a first end connected to a second end of the second conversion MOS transistor and a second end connected to the second voltage node, and
the control circuit controls the first conversion switch circuit and the second conversion switch circuit.

9. The phase locked loop circuit according to claim 2, wherein the current-voltage converter circuit includes:
a conversion MOS transistor with a first end connected to the first potential line and a second end connected to the second voltage node; and
a comparator that controls the conversion MOS transistor such that the first voltage node and the second voltage node are equal in voltage.

10. The phase locked loop circuit according to claim 2, wherein the first current switch circuit is capable of simultaneously insulating the first output node from the first voltage node and the first output node from the second voltage node, and
the second current switch circuit is capable of simultaneously insulating the second output node from the first voltage node and the second output node from the second voltage node.

11. The phase locked loop circuit according to claim 10, wherein the first current is set larger than the second current,
the control circuit controls the first current switch circuit and the second current switch circuit based on a digital code, and
the control circuit controls the first current switch circuit according to an amount of change of the digital code so as to simultaneously insulate the first output node from the first voltage node and the first output node from the second voltage node; meanwhile, the control circuit controls the second current switch circuit so as to switch between electrical connection between the second output node and the first voltage node and electrical connection between the second output node and the second voltage node.

12. The phase locked loop circuit according to claim 1, wherein the first current switch circuit is capable of simultaneously insulating the first output node from the first voltage node and the first output node from the second voltage node, and the second current switch circuit is capable of simultaneously insulating the second output node from the first voltage node and the second output node from the second voltage node.

13. The phase locked loop circuit according to claim 12, wherein the first current is set larger than the second current,
the control circuit controls the first current switch circuit and the second current switch circuit based on a digital code, and
the control circuit controls the first current switch circuit according to an amount of change of the digital code so as to simultaneously insulate the first output node from the first voltage node and the first output node from the second voltage node; meanwhile, the control circuit controls the second current switch circuit so as to switch between electrical connection between the second output node and the first voltage node and electrical connection between the second output node and the second voltage node.

14. The phase locked loop circuit according to claim 1, wherein the control circuit controls the first and second current switch circuits based on a digital code.

15. The phase locked loop circuit according to claim 1, further comprising a reference current source that outputs a reference current with a first end connected to the first potential line, and
a diode-connected reference MOS transistor with a first end connected to a second end of the reference current source and a second end connected to a second potential line,
wherein the first current source is a first current MOS transistor with a first end connected to the first output node, a second end connected to the second potential line, and a gate connected to a gate of the reference MOS transistor, and
the second current source is a second current MOS transistor with a first end connected to the second output node, a second end connected to the second potential line, and a gate connected to the gate of the reference MOS transistor.

16. The phase locked loop circuit according to claim 1, wherein the current outputted from the first current source is set larger than the current outputted from the second current source.

* * * * *